United States Patent [19]
Kubota et al.

[11] Patent Number: 5,152,390
[45] Date of Patent: Oct. 6, 1992

[54] AUTOMATIC CHIP SEPARATING AND FEEDING APPARATUS

[75] Inventors: Shigeru Kubota, Tokyo; Shoji Kanou, Yokohama; Masahiro Kubo, Sagamihara, all of Japan

[73] Assignee: Nitto Kogyo Kabushiki Kaisha, Tokyo, Japan

[21] Appl. No.: 625,926

[22] Filed: Dec. 29, 1990

[51] Int. Cl.⁵ .............................. B65G 47/04
[52] U.S. Cl. ................ 198/463.4; 198/471.1; 198/803.5
[58] Field of Search ............ 198/471.1, 463.4, 803.5

[56] References Cited

U.S. PATENT DOCUMENTS

| | | | |
|---|---|---|---|
| 2,860,761 | 11/1958 | Kocan et al. | 198/471.1 |
| 3,825,105 | 7/1974 | Cristiani | 198/471.1 |
| 4,830,169 | 5/1989 | Nariki et al. | 198/471.1 X |
| 4,907,688 | 3/1990 | Küpper | 198/463.4 |

FOREIGN PATENT DOCUMENTS 0026822 2/1984 Japan ............................ 198/471.1

Primary Examiner—D. Glenn Dayoan
Attorney, Agent, or Firm—Oblon, Spivak, McClelland, Maier & Neustadt

[57] ABSTRACT

An automatic chip separating and feeding apparatus capable of permitting chips to be individually separated and transferred at a high speed and with high reliability for charging. A chip transfer controller which includes a projectable stopper pin and a photosensor are arranged between a linear alignment feeder and any one of chip supports of a wheel to control the projecting of said stopper pin and the actuation of the wheel in association with detection by the photosensor to individually separate chips fed by the feeder and transfer them one by one to the chip supports of the wheel by suction.

3 Claims, 3 Drawing Sheets

AUTOMATIC CHIP SEPARATING AND FEEDING APPARATUS

BACKGROUND OF THE INVENTION

This invention relates to an automatic chip separating and feeding apparatus which is adapted to be typically used as a part of a taping machine, and more particularly to an apparatus adapted to carry out the operations of individually separating chips fed in a row from a linear alignment feeder of the vibration type or the like, transferring the separated chips one by one to chip supports circumferentially arranged at the periphery of a wheel to cause the chips to be supported in the chips supports, feeding the chips to a tape such as a paper tape, an embossed plastic tape or the like which travels, for example, straight due to rotation of the wheel, and individually separately charging the chip in chip charging holes of the tape using a suitable means, at a very high speed and with high accuracy.

Conventionally, various kinds of chip taping machines have been widely used for individually charging miniaturized or small-sized electronic components or chips one by one in chip charging holes of a tape to manufacture a chip tape. In such a taping process, a step of individually separately charging chip charging holes of a tape with a number of produced chips generally takes place by means of such an apparatus as shown in FIG. 4.

The apparatus of FIG. 4 is so constructed that chips t fed by a linear alignment feeder 1 of the vibrating type or the like which is adapted to carry chips while linearly aligning them are individually separately transferred to and supported in chip supports 2 circumferentially disposed at equal intervals on the periphery of a wheel 3, which are rotated to individually separately charge the chips from the chip supports 2 into chip charging holes 5 of a tape 4 linearly traveling in proximity to a part of the periphery of the wheel 3 and in synchronism with the rotation of the wheel. The charging may be carried out by outwardly pushing the chip t from the chip support 2 of the wheel 3 to drop it onto the tape 4.

Unfortunately, the conventional apparatus constructed as described above has some disadvantages.

First, it is highly difficult for the apparatus to rapidly and accurately carry out the operation of individually separately transferring the chips t to the chip supports 2 of the wheel 3 intermittently rotated at a high speed to support the former on the latter. This results in the apparatus encountering many problems such as a failure in the transfer and support of the chips on the chip supports 2, inaccurate supporting of the chips on the chip supports 2 and the like, so that the rate at which the apparatus individually separates the chips is limited to a level as low as about 500 chips/min.

Also, the failure in transferring of the chips to the chip supports 2 of the wheel 3, the inaccurate supporting of the chips on the chip supports 2 and the like causes a problem when the tips t are charged in the chip charging holes 5 of the tape 4 in the next step.

In the conventional apparatus, the chips t fed in a row from the linear alignment feeder 1 each are constantly contacted at the distal end thereof with the periphery of the wheel 3. This causes the wheel to be highly damaged due to wearing because the chips are made of a rigid ceramic material, resulting in the durability of the wheel being deteriorated.

SUMMARY OF THE INVENTION

The present invention has been made in view of the foregoing disadvantages of the prior art.

Accordingly, it is an object of the present invention to provide an automatic chip separating and feeding apparatus which is capable of permitting chips to be individually separated and transferred at a high speed and with high reliability for charging.

It is another object of the present invention to provide an automatic chip separating and feeding apparatus which is capable of accurately carrying out the transferring of chips without causing any trouble.

It is a further object of the present invention to provide an automatic chip separating and feeding apparatus which is capable of exhibiting satisfactory durability.

In accordance with the present invention, there is provided an automatic chip separating and feeding apparatus comprising a wheel including chip supports arranged at the periphery of the wheel at equal intervals so as to fittedly support chips therein, the chip supports each being formed at the distal end thereof with an air suction port, a linear alignment feeder arranged opposite to the chip supports, and a chip transfer controller arranged between the distal end of the linear alignment feeder and the wheel, the chip transfer controller including a projectable stopper pin and a photosensor and controlling the projection of the stopper pin and the actuation of the wheel in association with detection by the photosensor.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein.

DETAILED DESCRIPTION OF THE PREFERRED EMBODIMENT

Figure 1:
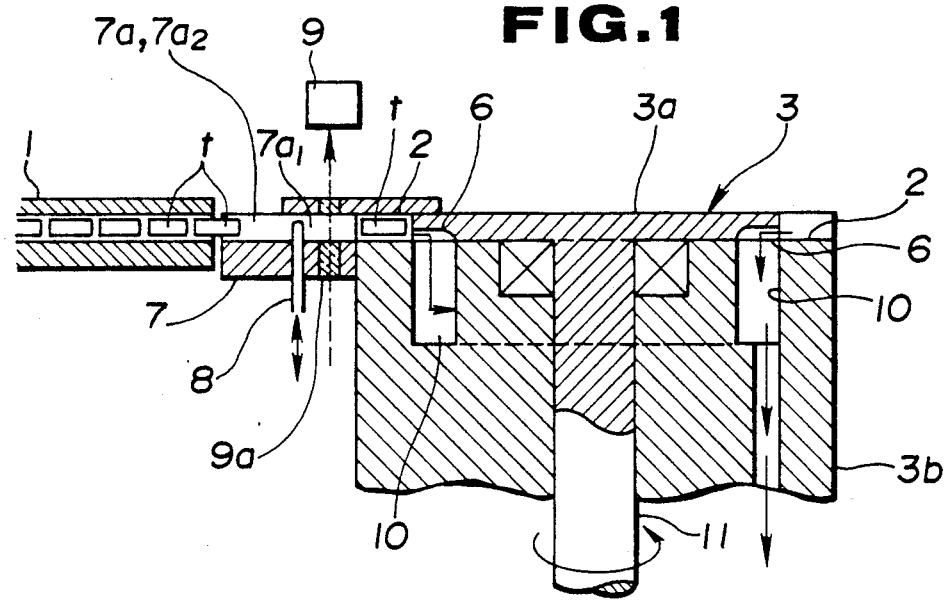
FIG. 1 is a vertical sectional elevation view showing an embodiment of an automatic chip separating and feeding apparatus according to the present invention.
Figure 2:
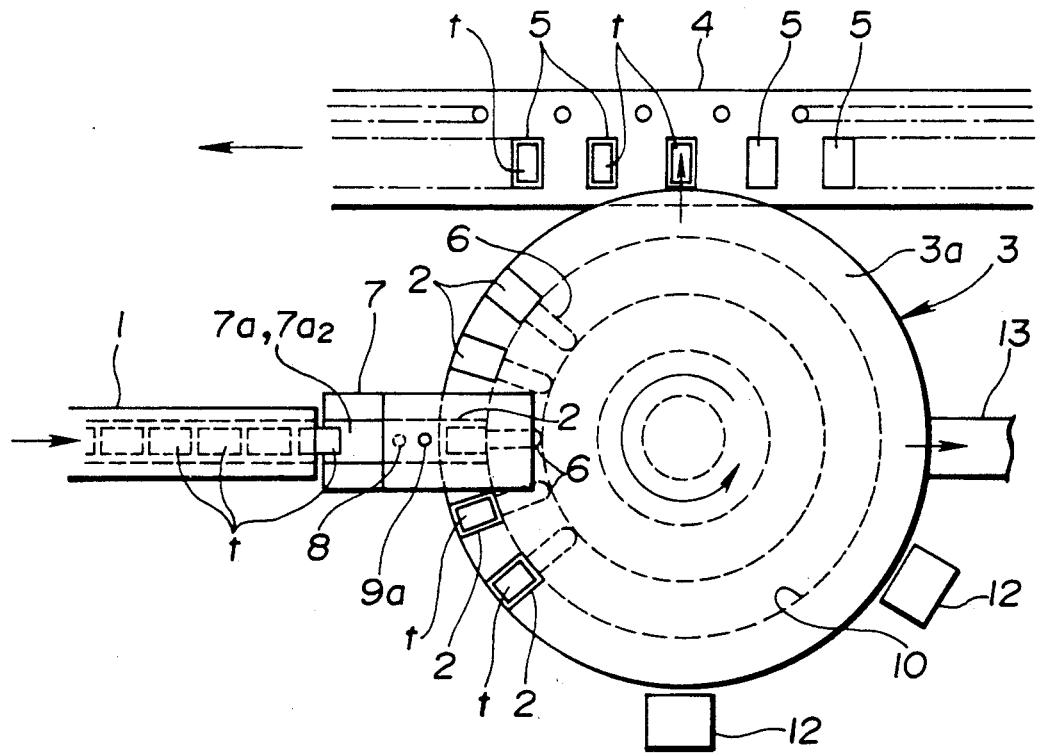
FIG. 2 is a plan view of the apparatus shown in FIG. 1.
Figure 3:
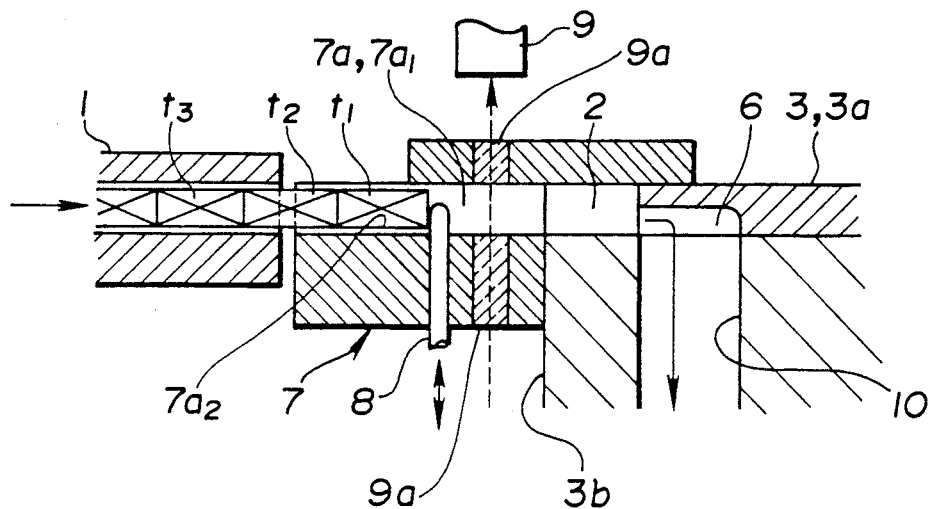
FIGS. 3A and 3B each are a fragmentary sectional view showing the operation of individually separating and transferring chips by the apparatus shown in FIG. 1.
Figure 3:
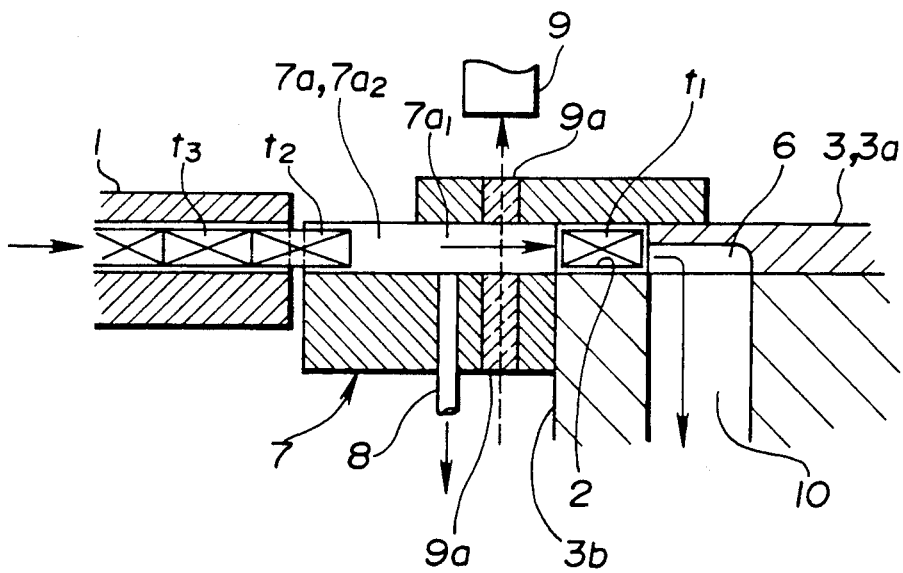
Figure 4:
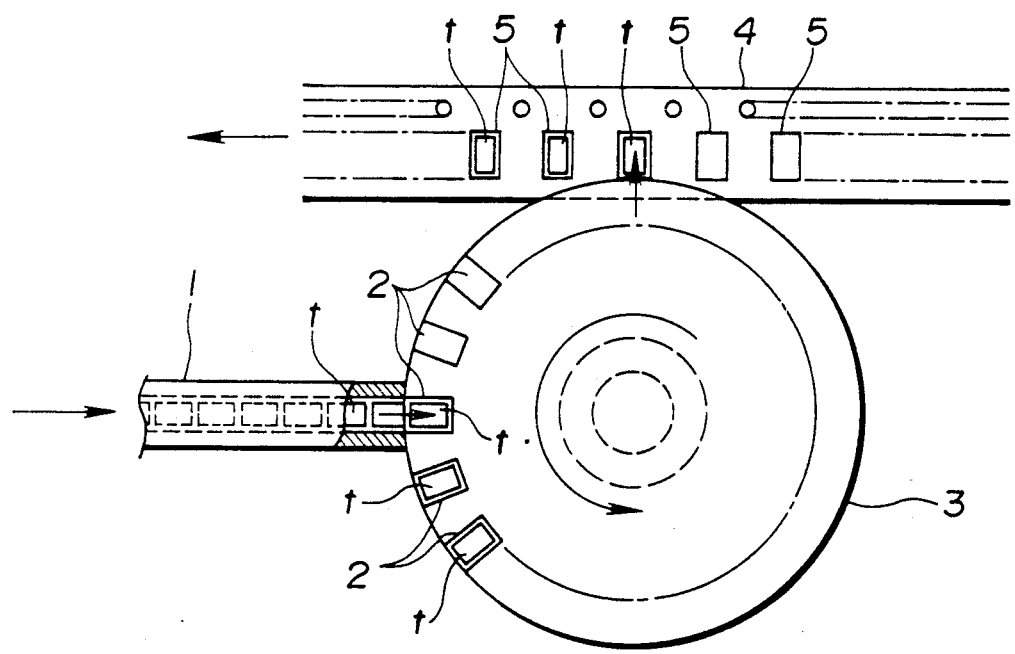
FIG. 4 is a plan view showing a conventional chip separating and feeding apparatus.

Now, an automatic chip separating and feeding apparatus according to the present invention will be described hereinafter with reference to FIGS. 1 to 3B.

FIGS. 1 to 3B show an embodiment of an automatic chip separating and feeding apparatus according to the present invention. An apparatus of the illustrated embodiment includes a linear alignment feeder 1 for carrying chips t while linearly aligning them and a wheel 3 having chip supports 2 circumferentially provided at equal intervals on the periphery thereof. The chip supports 2 are arranged so as to fittedly support the chips t therein under the same horizontal conditions as carried by the linear alignment feeder 1. The chip supports 2 each are provided at the distal end thereof with an air suction port 6.

The apparatus also includes a chip transfer controller 7 arranged between the wheel 3 and the distal end of the linear alignment feeder 1 positioned opposite to the chip supports 2 of the wheel 3. The chip transfer controller 7 includes a stopper pin 8 which is vertically movable or projectably arranged and a photosensor 9, and is constructed so as to control the actuation of the stopper pin 8 and wheel 3 in association with detection by the photosensor 9.

The wheel 3 includes a rotation section 3a which is controllably intermittently rotated by means of a pulse motor or the like. The above-described chip supports 2 circumferentially arranged at equal intervals and each comprising a small recess of a substantially rectangular shape are provided at the periphery of the rotation section 3a, and the air suction ports 6 each communicating with the distal end of the chip supports 2 are formed on the lower surface of the rotation section 3a. The rotation section 3a is adapted to be driven or rotated by a pulse motor or the like. The wheel 3 also includes a stationary section 3b which is arranged below the rotation section 3a in a manner to be contiguous thereto and formed with an annular air suction groove 10 communicating with the air suction ports 6, so that air may be constantly sucked from the chip supports 2 through the air suction groove 10 into the wheel 3.

The chip transfer controller 7 includes a chip passage 7a through which the linear alignment feeder 1 is connected at the distal end thereof to the chip supports 2 of the wheel 3. The chip passage 7a comprises a suction section $7a_1$ arranged on the side of the chip supports 2 and constructed in an airtight manner or formed into a tubular configuration and a non-suction section $7a_2$ arranged on the side of the feeder 1 and constructed into an open configuration. The stopper pin 8 is upward projectably arranged adjacent to the inlet of the suction section $7a_1$ of the chip passage 7a. Forward of the stopper pin 8 is positioned a light transmission window 9a for transmitting light from the photosensor 9. The light transmission window 9a may be constructed, for example, by closely fitting a light-permeable plastic member in a through-hole formed at the suction section $7a_1$ of the chip passage 7a to permit light from the photosensor to transmit therethrough.

Reference numerals 11, 12 and 13 designate a revolving shaft of the rotation section 3a of the wheel 3, inspection sections arranged around the wheel 3, and a defective-chip removing section, respectively.

Now, the manner of operation of the chip separating and feeding apparatus of the illustrated embodiment may be described hereinafter.

Of the chips t carried through the linear alignment feeder 1 in turn in a row due to vibration, a foremost chip $t_1$, as shown in FIG. 3A, collides with the stopper pin 8 which has been upwardly projected near the inlet of the suction section $7a_1$ of the chip passage 7a, resulting in it being stopped.

However, the suction section $7a_1$ is constructed in an air-tight manner or into a tubular configuration and communicates with the chip support 2 and air suction port 6 corresponding thereto, so that chip suction force acts on the distal end of the foremost chip $t_1$ through the suction section $7a_1$ and chip support 2 due to air suction carried out through the air suction port 6.

The non-suction section $7a_2$ of the chip passage 7a is open to an ambient atmosphere, therefore, the above-described suction force is not applied to the non-suction section $7a_2$. Thus, the chip suction force acts on only the foremost chip $t_1$, so that the succeeding chips $t_2$, $t_3$,—are fully free from the suction force.

Then, when the stopper pin 8 is lowered or retracted, the chip suction force permits the foremost chip $t_1$ to forwardly move in the suction section $7a_1$, resulting in it being suckedly held to the air suction port 6. Thus, the chips t are transferred individually separately or one by one to the chip supports 2 of the wheel 3, as shown in FIG. 3B.

The photosensor 9 detects a moment at which the foremost chip $t_1$ intercepts the light transmission window 9a during the movement of the chip from the stop pin 8 to the chip support 2, to thereby cause the stopper pin 8 to be upwardly projected again. Also, the photosensor 9 detects a moment at which the chip $t_1$ goes past the light transmission window to permit light to transmit therethrough, to thereby drive the pulse motor. This causes the rotation section 3a of the wheel 3 to be rotated to feed the foremost chip $t_1$ to the next position, resulting in the next chip support 2 for the next chip $t_2$ being substituted for the chip support 2 for the foremost chip $t_1$ and the wheel 3 being stopped.

When the stopper pin 8 is kept upwardly projected after the pin is lowered in order to cause the foremost chip $t_1$ to be transferred to the chip support 2, the chip suction force acts on only the chip $t_1$ to transfer it to the chip support 2, resulting in the subsequent chip $t_2$ being free from the force, so that a blank occurs between the stopper pin 8 and the chip $t_2$ or at the non-suction section $7a_2$. However, the chip suction force does not act on the blank, to thereby cause the next chip $t_2$ to be forwardly moved until it collides with the re-projected stopper pin 8 due to forward movement of the subsequent chips carried out by the linear alignment feeder 1.

Thus, the apparatus returns to the original or initial state and the above-described procedures are repeated.

In brief, the stopper pin 8 is lowered at the same time when the wheel 3 is stopped, so that the foremost chip $t_1$ is sucked and transferred to the chip support 2. Then, the photosensor 9 actuates to cause the stopper pin 8 to be upwardly projected again and concurrently the wheel 3 is rotated. Subsequently, the wheel is stopped and concurrently the stopper pin 8 with which the next chip collides due to its forward movement is lowered.

The above-described operation of the apparatus is repeatedly carried out at a very high speed of a speed as high as 1500 to 2000 cycles/min and with high accuracy.

The wheel 3 having the chips supported on the chip supports 2 carries them by its own rotation and the inspection sections 12 inspect the electrical performance of the chips. The defect-chip removing section 13 acts to remove chips rejected by the inspection sections 12 from the chip supports 2. Then, accepted chips are charged in the chip charging holes 5 of the tape 4 at a position right above the tape 4.

As can be seen from the foregoing, the chip separating and feeding apparatus of the present invention is so constructed that the chip supports of the wheel are arranged so as to fittedly support chips therein while keeping them under the same horizontal conditions as fed by the linear alignment feeder and the chip supports each are formed at the distal end thereof with the air suction port to constantly suck air therethrough to generate chip suction force. Such construction permits the suction force to instantaneously act on the chips linearly moved toward each of the chip supports on the same horizontal plane in turn, so that the chips may be fittedly supported in the chip supports at a very high speed and with high accuracy. Thus, the present invention permits the separation and transfer of the chips to be accomplished at a speed several times as much as in the prior art.

Also, as described above, transmission and interception of light with respect to the light transmission window are carried out at a moment when the chip is transferred to the chip support and the sensor detects the transmission and interception to actuate the stopper pin and intermittently rotate the wheel to align the next chip support with the next chip. This permits the wheel to be rotated only after the chip is fully transferred to the chip support, so &hat the rotation of the wheel may be carried out in synchronism with the completion of transfer of the chip to the chip support, unlike simple intermittent rotation of the wheel at a constant speed in the prior art. Thus, the chip may be accurately transferred to the wheel, to thereby eliminate any trouble in the chip transfer.

Further, the wheel is rotated in synchronism with the transfer of the chip, so that an increase in rate of feeding of the chips by the linear alignment feeder permits a speed at which the chips are transferred to the chip supports to be correspondingly increased. Thus, the present invention allows the feeder to exhibit a chip feed capability several times as large as the prior art. The above-described embodiment of the present invention can transfer the chips at a rate as high as 1500 to 2000 chips/min.

Furthermore, in the present invention, the chips linearly fed in a row by the linear alignment feeder each are temporarily stopped by the stopper pin of the chip transfer controller, to thereby eliminate the disadvantage of the prior art that the periphery of the wheel is worn and/or damaged due to pressed contact of the distal end of the chip with the periphery of the wheel which constantly occurs, resulting in the durability of the wheel which is highly expensive being significantly improved.

Moreover, the chip passage of the chip transfer controller comprises the suction section and non-suction section, to thereby cause the suction force to act on only the foremost chip which collides with the stopper pin arranged near the inlet of the suction port and cause the next chip positioned on the non-suction section to be fully free from the suction force, resulting in effectively preventing a trouble that two or more chips are concurrently transferred to the chip support.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An automatic chip separating and feeding apparatus comprising:
   a rotatable wheel comprising chip supports arranged at a periphery of said wheel, said chip supports being arranged at equal intervals so as to fittedly support chips therein;
   an air suction port formed at a distal end of each of said chip supports;
   a linear alignment feeder arranged opposite to said chip supports; and
   a chip transfer controller arranged between a distal end of said linear alignment feeder and said wheel;
   said chip transfer controller comprising:
   a chip passage through which said linear alignment feeder is connected to said chip supports of said wheel, said chip passage comprising a suction section adjacent to said chip supports which is acted on by a suction force from said air suction port, and a non-suction section adjacent to said linear alignment feeder which is not acted on by suction force from said air suction port;
   a movable projectable stopper pin for blocking a movement of said chips through said chip passage in a projected state and permitting movement of said chips through said chip passage in a retracted state, said projectable stopper pin being disposed in said suction section of said chip passage such than when said pin is in said projected state, suction force from said air suction port acts on a foremost chip blocked by said projected stopper pin and not on a chip positioned linearly behind said foremost chip so that when said pin is in said retracted state, only one chip at a time is transferred to said chip supports by said suction force; and
   photosensing means for detecting a presence of a chip and controlling the movement of said projectable stopper pin and the rotation of said wheel in response thereto.

2. An automatic chip separating and feeding apparatus as defined in claim 1, wherein said chip supports of said wheel each comprise a small recess horizontally formed into a rectangular shape on the periphery of said wheel;
   said wheel including a rotation section which is controllably intermittently rotated through a drive means and provided at the periphery thereof with said chip support sections;
   said wheel also including a stationary section which is arranged below said rotation section and formed with an annular air suction groove communicating with said air suction ports, whereby air may be constantly sucked from said chip supports through said air suction groove into said wheel.

3. An automatic chip separating and feeding apparatus as defined in claim 1, wherein said photosensing means comprises a light transmission window located between said projectable stopper pin and said chip supports.

* * * * *